United States Patent
Oh et al.

(10) Patent No.: US 10,222,539 B2
(45) Date of Patent: Mar. 5, 2019

(54) LIGHT EMITTING DEVICE PACKAGE, BACKLIGHT UNIT, AND METHOD OF MANUFACTURING LIGHT EMITTING APPARATUS

(71) Applicant: LUMENS CO., LTD., Yongin-si, Gyeonggi-do (KR)

(72) Inventors: Seung-Hyun Oh, Gwangju-si (KR); Dae-Gil Jung, Osan-si (KR); Jung-Hyun Park, Osan-si (KR); Hyo-Gu Jeon, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/896,910

(22) Filed: Feb. 14, 2018

(65) Prior Publication Data

US 2018/0172899 A1    Jun. 21, 2018

Related U.S. Application Data

(63) Continuation of application No. 15/135,704, filed on Apr. 22, 2016, now Pat. No. 9,933,560.

(30) Foreign Application Priority Data

Apr. 22, 2015 (KR) .................. 10-2015-0056682
Jul. 14, 2015 (KR) .................. 10-2015-0099949

(51) Int. Cl.
*G02B 6/00* (2006.01)
*H01L 33/60* (2010.01)
(Continued)

(52) U.S. Cl.
CPC ......... *G02B 6/0073* (2013.01); *G02B 6/0031* (2013.01); *G02B 6/0068* (2013.01);
(Continued)

(58) Field of Classification Search
CPC ......... H01L 24/02; H01L 24/03; H01L 24/06; H01L 25/0753; H01L 25/0756; H01L 33/486; G02B 6/0011; G02B 6/0013; G02B 6/002; G02B 6/0021; G02B 6/0023; G02B 6/0025; G02B 6/0026; G02B 6/0028;
(Continued)

(56) References Cited

U.S. PATENT DOCUMENTS

2005/0167682 A1   8/2005  Fukasawa
2006/0220030 A1*  10/2006 Tain .................. F21K 9/00
                                                   257/79

(Continued)

FOREIGN PATENT DOCUMENTS

KR       10-1377603 B1      3/2014

OTHER PUBLICATIONS

Communication pursuant to Art. 94(3) EPC in European Application No. 16166399.2, dated Feb. 19, 2018.

*Primary Examiner* — Suezu Ellis
(74) *Attorney, Agent, or Firm* — Mei & Mark LLP

(57) ABSTRACT

Disclosed herein are a light emitting device package, a backlight unit, and a method of manufacturing a light emitting apparatus capable of being used for a display application or an illumination application. The light emitting device package includes: a substrate, a light emitting, a reflection molding member, an upper cover, and an interval maintaining part.

11 Claims, 11 Drawing Sheets

(51) Int. Cl.
*H01L 33/50* (2010.01)
*F21V 8/00* (2006.01)
*H01L 33/48* (2010.01)
*H01L 33/58* (2010.01)

(52) U.S. Cl.
CPC .......... *G02B 6/0091* (2013.01); *H01L 33/486* (2013.01); *H01L 33/58* (2013.01); *H01L 33/60* (2013.01); *H01L 33/505* (2013.01)

(58) Field of Classification Search
CPC .... G02B 6/003; G02B 6/0031; G02B 6/0066; G02B 6/0073; G02B 6/0088; G02B 6/0091
USPC ............... 362/606, 612, 615, 623, 97.1–97.3
See application file for complete search history.

(56) References Cited

U.S. PATENT DOCUMENTS

| | | | | |
|---|---|---|---|---|
| 2007/0205427 | A1* | 9/2007 | Tain | H01L 33/385 |
| | | | | 257/99 |
| 2011/0127558 | A1* | 6/2011 | Park | H01L 33/54 |
| | | | | 257/98 |
| 2011/0242840 | A1* | 10/2011 | Kim | G02B 6/0021 |
| | | | | 362/606 |
| 2012/0153337 | A1* | 6/2012 | Kong | H01L 33/62 |
| | | | | 257/98 |

* cited by examiner

LIGHT EMITTING DEVICE PACKAGE, BACKLIGHT UNIT, AND METHOD OF MANUFACTURING LIGHT EMITTING APPARATUS

CROSS REFERENCE TO RELATED APPLICATIONS

This application is a continuation of U.S. patent application Ser. No. 15/135,704, filed on Apr. 22, 2016, which claims priority to Korean Patent Application No. 10-2015-0056682, filed on Apr. 22, 2015 and No. 10-2015-0099949, filed on Jul. 14, 2015, the entire contents of which are herein incorporated by reference in their entireties.

BACKGROUND

Field

The present invention relates to a light emitting device package, a backlight unit, and a method of manufacturing a light emitting apparatus, and more particularly, a light emitting device package, a backlight unit, and a method of manufacturing a light emitting apparatus capable of being used for a display application or an illumination application.

Description of the Related Art

A light emitting diode (LED) indicates a kind of semiconductor device capable of implementing various colors of light by forming a PN diode using a compound semiconductor to configure a light emitting source. The LED has a long lifespan, may be miniaturized and become light, and may be driven at a low voltage. In addition, the LED is robust to impact and vibration, does not require a preheating time and complicated driving, and may be mounted in various shapes on a substrate or a lead frame and be then packaged, such that the LED may be modularized for several applications and be used in a backlight unit, various illumination apparatuses, or the like.

SUMMARY

Side view type light emitting device packages used in an edge type backlight unit according to the related art are installed at edge portions of a light guide plate and irradiate light to the light guide plate. In the side view type light emitting device packages, a predetermined optical spaced distance between a light emitting device and the light guide plate should be maintained so that optical characteristics of the light emitting device packages may be implemented in a designed form.

In the related art, a spacer contacting the light guide plate was installed on one side surface of a module substrate on which a plurality of light emitting device packages are installed in order to maintain the predetermined spaced distance between the light emitting device and the light guide plate as described above.

However, in the related art in which the spacer formed on one side surface of the module substrate is used, in the case in which the light emitting device package is finely misaligned with the module substrate, a spaced distance between the light guide plate and the module substrate may be maintained, but a spaced distance between the light guide plate and the misaligned light emitting device package is changed, such that a phenomenon such as a decrease in luminous intensity, a decrease in color feeling, or the like, occurs, and light efficiency is decreased.

The present invention is to solve several problems including the problems as described above, and an object of the present invention is to provide a light emitting device package, a backlight unit, and a method of manufacturing a light emitting apparatus in which an interval maintaining part contacting a light guide plate may be installed at an upper cover that may be precisely aligned with and be fixed to a reflection molding member to precisely maintain a spaced distance between a light emitting device and the light guide plate, thereby making it possible to improve luminous intensity, color feeling, light efficiency, various light emitting apparatuses including a light conversion material and a light emitting device may be installed to produce good quality products. However, this object is only an example, and the scope of the present invention is not limited thereto.

According to an exemplary embodiment of the present invention, a light emitting device package may include: a substrate having a first electrode formed at one side thereof on the basis of an electrode separation line and a second electrode formed at the other side thereof on the basis of the electrode separation line; a light emitting device including a first pad electrically connected to the first electrode and a second pad electrically connected to the second electrode; a reflection molding member installed on the substrate, having a form in which a front surface thereof is opened so as to induce light generated in the light emitting device toward the front of the light emitting device package, and having a reflection cup part of which an upper portion is opened so as to accommodate the light emitting device therein; an upper cover formed in a shape corresponding to that of an upper surface of the reflection molding member so as to cover the light emitting device and the opened upper portion of the reflection cup part of the reflection molding member; and an interval maintaining part formed at the upper cover so that a predetermined optical interval is maintained between a light guide plate and the light emitting device and protruding from a front surface of the upper cover toward the light guide plate so that a front end thereof contacts the light guide plate.

The interval maintaining part may have a light guide plate contacting surface formed at the front end thereof and contacting the light guide plate, and be partially or generally lengthily formed above an inlet of the reflection cup part.

The upper cover may be a plate-shaped reflector having at least one portion accommodated in a cover accommodation groove formed in the reflection molding member so as to be fixed to the reflection molding member and formed of a metal.

The upper cover may include at least one of a left protrusion formed in at least one portion of a left side surface of the upper cover and protruding leftward, a rear protrusion formed in at least one portion of a rear surface of the upper cover and protruding rearward, and a right protrusion formed in at least one portion of a right side surface of the upper cover and protruding rightward, and the cover accommodation groove may include at least one of a left groove part corresponding to the left protrusion, a rear groove part corresponding to the rear protrusion, and a right groove part corresponding to the right protrusion.

The cover accommodation groove may include an adhesive accommodation groove in which an adhesive adhering the upper cover to the reflection molding member is accommodated so that the upper cover is adhered and fixed to the reflection molding member.

The light emitting device may be a horizontal mounting type light emitting device having a first pad formed on one portion of a lower surface thereof and a second pad formed on the other portion of the lower surface thereof and having a light emitting layer formed to be in parallel with the first pad and the second pad, electrically connected to the substrate so that the first pad and the second pad are in parallel with the substrate. The horizontal mounting type light emitting device may include reflectors each formed on one portion of an upper surface thereof and one portion of the lower surface thereof so as to induce light generated in the light emitting layer in a direction that is in parallel with the first pad and the second pad.

The light emitting device may be a vertical mounting type light emitting device having a light emitting layer so as to be in parallel with the first pad and the second pad and electrically connected to the substrate so that the first pad and the second pad are perpendicular to the substrate. The vertical mounting type light emitting device may include a reflector formed on at least one portion of at least one of side surfaces thereof so as to induce light generated in the light emitting layer in a direction that is perpendicular to the first pad and the second pad.

The light emitting device may be a flip-chip type light emitting diode (LED) including the first pad formed on one portion of a lower surface thereof so as to be electrically connected to the first electrode and a second pad formed on the other portion of the lower surface thereof so as to be electrically connected to the second electrode and seated on the electrode separation line.

The light emitting device package may further include a light conversion material attached onto at least one portion of at least one surface of the light emitting device. The horizontal mounting type light emitting device may include a light conversion material formed to enclose at least one of four side surfaces thereof, that is, a front surface, a left side surface, a right side surface, and a rear surface thereof, except for an upper surface and the lower surface thereof. The vertical mounting type light emitting device may include a light conversion material formed to enclose at least one of the upper surface and four side surfaces thereof except for the lower surface thereof.

The light conversion material enclosing the light emitting device may have the same thickness in the respective surfaces of the light emitting device or have a thickness different in at least one of the respective surfaces of the light emitting device.

An inclined surface or a curved surface may be formed on an outer surface of the light conversion material enclosing the light emitting device on at least one of the respective surfaces of the light emitting device.

The light emitting device package may further include a lens part formed on at least one of the respective surfaces of the light emitting device on which the light conversion material enclosing the light emitting device is formed and inducing a path of light.

According to another exemplary embodiment of the present invention, a backlight unit may include: a substrate having a first electrode formed at one side thereof on the basis of an electrode separation line and a second electrode formed at the other side thereof on the basis of the electrode separation line; a light emitting device including a first pad electrically connected to the first electrode and a second pad electrically connected to the second electrode; a reflection molding member installed on the substrate, having a form in which a front surface thereof is opened so as to induce light generated in the light emitting device toward the front of the light emitting device package, and having a reflection cup part of which an upper portion is opened so as to accommodate the light emitting device therein; an upper cover formed in a shape corresponding to that of an upper surface of the reflection molding member so as to cover the opened upper portion of the reflection cup part of the reflection molding member; a light guide plate installed in a light path of the light emitting device; and an interval maintaining part formed at the upper cover so that a predetermined optical interval is maintained between the light guide plate and the light emitting device and protruding from a front surface of the upper cover toward the light guide plate so that a front end thereof contacts the light guide plate.

According to still another exemplary embodiment of the present invention, a method of manufacturing a light emitting apparatus may include: a release paper preparing step of preparing a release paper having an adhesion surface formed on one surface thereof; a light emitting device seating step of seating a plurality of light emitting devices on the release paper; a light conversion material applying step of applying the light conversion material onto the release paper by allowing the light conversion material in a flow state to flow in a space between the light emitting device and a neighboring light emitting device at a height equal to or lower than a height of an upper surface of the light emitting device so that a light conversion material encloses side surfaces of the light emitting devices; a light conversion material hardening step of hardening the light conversion material; and a singulation step of cutting the light conversion material along cutting lines so as to be singulated into a plurality of unit light emitting apparatuses. The light emitting device may be a flip-chip type light emitting device, and may include reflectors each installed on the upper surface and a lower surface thereof so as to induce generated light toward side surfaces thereof.

DETAILED DESCRIPTION

Figure 1:
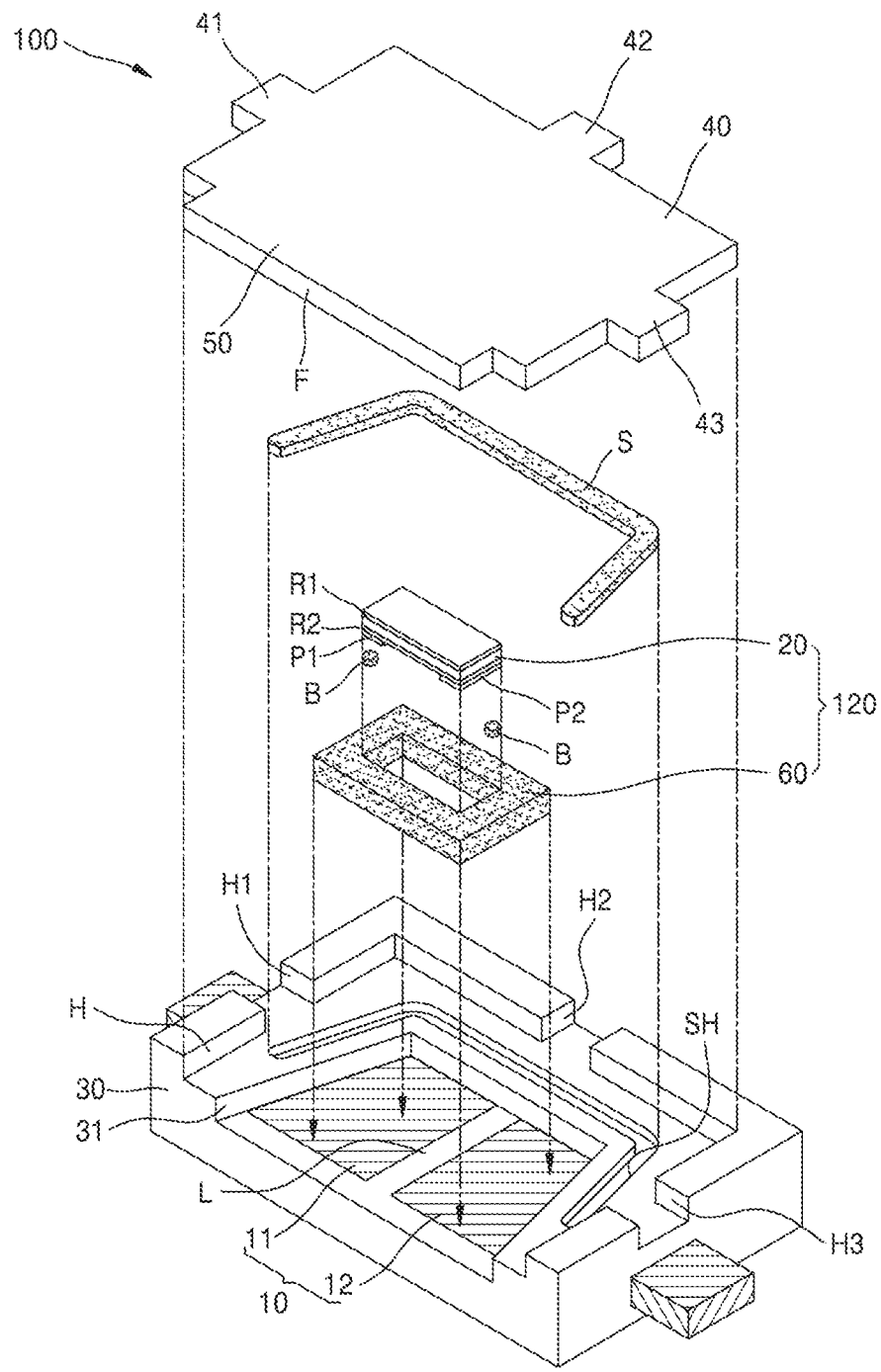
FIG. 1 is an exploded perspective view illustrating a light emitting device package according to some exemplary embodiments of the present invention.

Hereinafter, several exemplary embodiments of the present invention will be described in detail with reference to the accompanying drawings.

Exemplary embodiments of the present invention will be provided only in order to further completely describe the present invention to those skilled in the art, the following exemplary embodiments may be modified into several other forms, and the scope of the present invention is not limited to the following exemplary embodiments. Rather, these exemplary embodiments make the present disclosure thorough and complete, and are provided in order to completely transfer the spirit of the present invention to those skilled in the art. In addition, thicknesses or sizes of the respective layers in the drawings have been exaggerated for convenience and clarity of explanation.

FIG. 1 is an exploded perspective view illustrating a light emitting device package 100 according to some exemplary embodiments of the present invention. In addition, FIG. 2 is an assembled perspective view of the light emitting device package 100 of FIG. 1, and FIG. 3 is a plane view illustrating a module substrate M on which the light emitting device packages 100 of FIG. 1 are mounted and a backlight unit 1000 according to some exemplary embodiments of the present invention.

Figure 2:
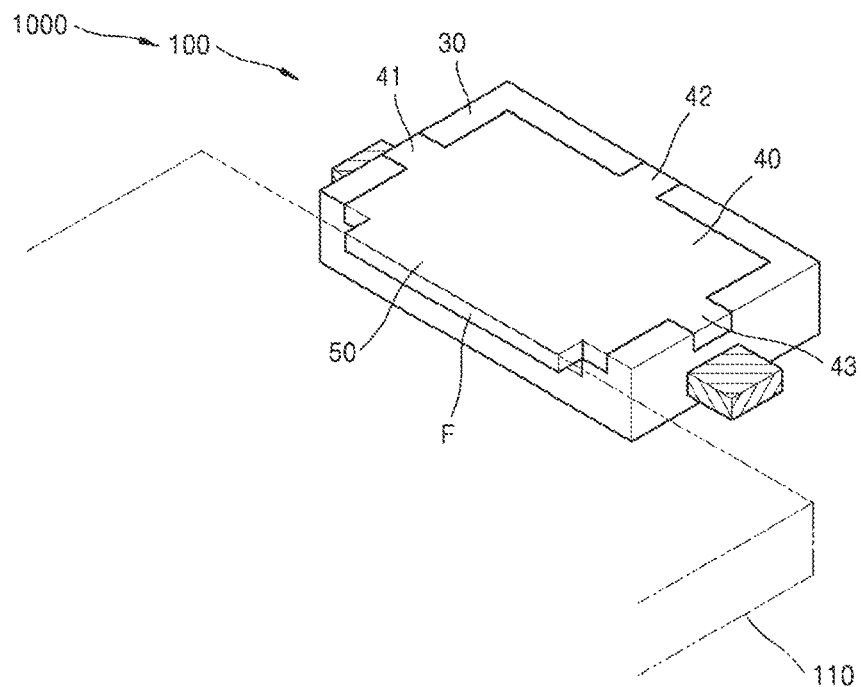
FIG. 2 is an assembled perspective view of the light emitting device package of FIG. 1.
Figure 3:
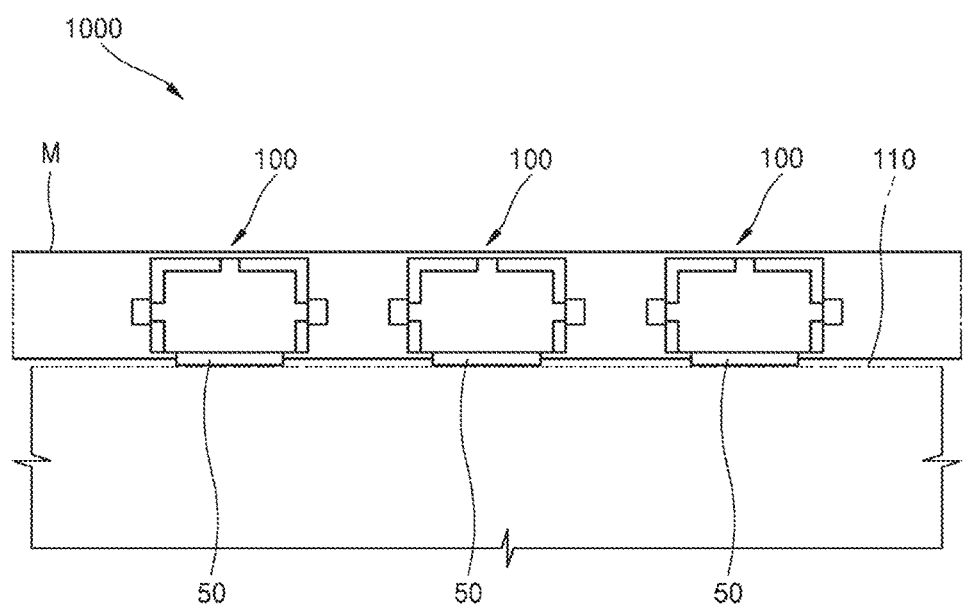
FIG. 3 is a plane view illustrating a module substrate on which the light emitting device packages of FIG. 1 are mounted and a backlight unit according to some exemplary embodiments of the present invention.

First, as illustrated in FIGS. 1 to 3, the light emitting device package 100 according to some exemplary embodiments of the present invention may mainly include a substrate 10, a light emitting device 20, a reflection molding member 30, an upper cover 40, and an interval maintaining part 50.

Figure 18A:
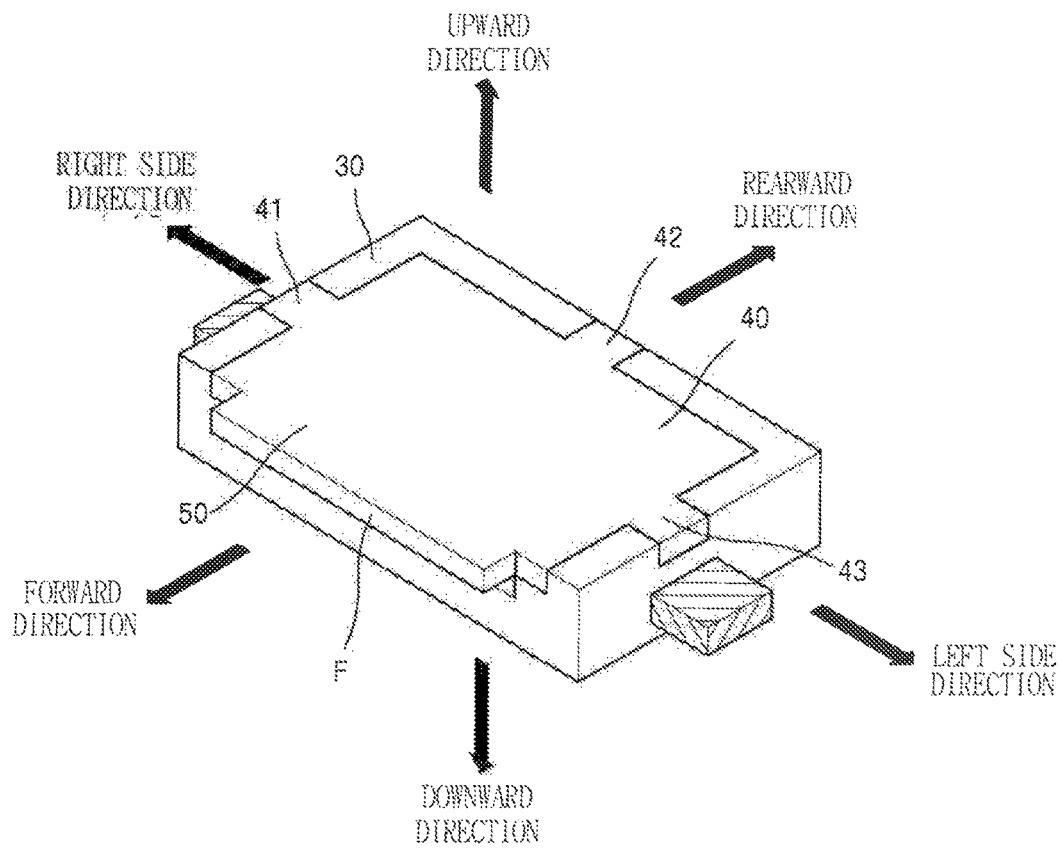
FIGS. 18A and 18B are reference views illustrating directions of light emitting device packages according to several exemplary embodiments of the present invention.

Here, as illustrated in FIG. 18A, a forward direction of the light emitting device package 100 is a direction in which light generated in the light emitting device 20 is emitted through an opened front surface of the reflection molding member 30, and a rearward direction of the light emitting device package 100 is an opposite direction to the forward direction. Meanwhile, a downward direction of the light emitting device package 100 is a direction in which the substrate 10 is provided, and an upward direction of the light emitting device package 100 is an opposite direction to the downward direction. In addition, a right side direction of the light emitting device package 100 is a right direction in relation to the forward direction, and a left side direction of the light emitting device package 100 is an opposite direction to the right side direction.

Figure 18B:
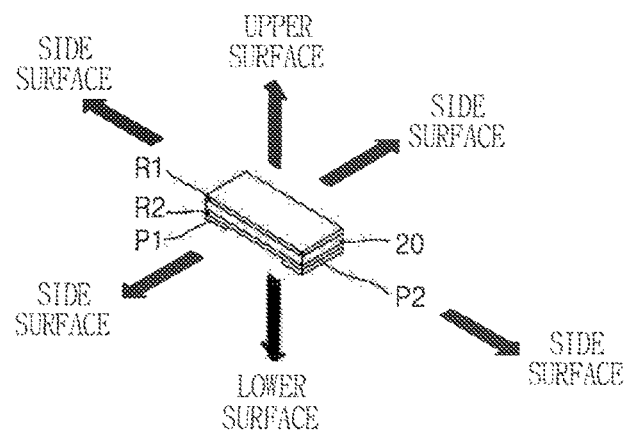

Meanwhile, as illustrated in FIG. 18B, a lower surface of the light emitting device 20 is a surface on which at least one of a first pad and a second pad is provided, and an upper surface of the light emitting device 20 is a surface facing the lower surface. In addition, four side surfaces of the light emitting device 20 are surfaces forming side surfaces on the basis of the lower surface and the upper surface.

For example, as illustrated in FIGS. 1 to 3, the substrate 10 has a first electrode 11 formed at one side thereof on the basis of an electrode separation line L and a second electrode 12 formed at the other side thereof on the basis of the electrode separation line L, may mount at least one light emitting device 20 thereon, is electrically connected to the light emitting device 20 by the first electrode 11 and the second electrode 12, and may be formed of a material having appropriate mechanical strength so as to support the light emitting device 20. Here, at least one electrode separation line L may be formed on the substrate 10, and a plurality of light emitting devices may be mounted on the substrate 10, if necessary.

In more detail, for example, as illustrated in FIGS. 1 to 3, metal substrates formed of aluminum, copper, zinc, tin, lead, gold, silver, or the like, and having a plate form or a lead frame form may be used as the substrate 10. In addition, the substrate 10 may be a printed circuit board (PCB) on which a wiring layer is formed or a flexible printed circuit board (FPCB) formed of a flexible material, or may contain a metal and partially contain a resin, a synthetic resin such as glass epoxy, or the like, or a ceramic material in consideration of thermal conductivity, and may contain one or more materials selected from the group consisting of at least an epoxy molding compound (EMC), polyimide (PI), graphene, glass synthetic fiber, and combinations thereof in order to improve workability.

In addition, for example, as illustrated in FIGS. 1 to 3, the light emitting device 20 may be a flip-chip type horizontal mounting type light emitting device having a first pad P1 formed at one portion of a lower surface thereof and electrically connected to the first electrode 11 and a second pad P2 formed at the other portion of the lower surface thereof and electrically connected to the second electrode 12 and seated on the electrode separation line L using bonding media B. In another exemplary embodiment, the horizontal mounting type light emitting device may include reflectors R1 and R2 each installed on an upper surface and a lower surface thereof so as to induce generated light toward side surfaces of the light emitting device 20.

As the light emitting device 20, a side view type light emitting device 20 having double-sided reflectors R1 and R2, which are a brag reflection layer or a metal reflection layer, each installed on an upper surface and a lower surface thereof so as to secure an active layer having a sufficiently wide area. Therefore, since the side view type light emitting device 20 is seated on the substrate 10 in a horizontal state and light is induced toward side surfaces, the light emitting device package may be ultra-thinned. In addition, the bonding media B are adhered in a form in which they are compressed in a disk shape between the first pad P1 in a horizontal state and the first electrode 11 in a horizontal state and between the second pad P2 in a horizontal state and the second electrode 12 in a horizontal state, and electrically and physically connect firmly the first pad P1 and the first electrode 11 to each other, and various types of bonding media containing a solder component such as a solder paste, a solder, or the like may be used as the bonding media B.

Here, the light emitting device 20 described above may be any one of a blue light emitting diode (LED), a red LED, and a green LED. Alternatively, the light emitting device 20 may be an LED generating light having various wavelengths or an ultraviolet LED. However, the light emitting device 20 is not necessarily limited thereto. That is, various horizontal type or vertical type LEDs or various types of light emitting devices on which signal transfer media such as various bumps, wires, solders, or the like, are installed may be used as the light emitting device 20.

In addition, for example, the light emitting device 20, which is formed of a semiconductor, may be configured by epitaxially growing a nitride semiconductor such as InN, AlN, InGaN, AlGaN, InGaAlN, and the like, on a sapphire substrate or a silicon carbide substrate for growth by a vapor growth method such as a metal organic chemical vapor deposition (MOCVD) method, or the like. In addition, the light emitting device 20 may be formed using semiconductors such as ZnO, ZnS, ZnSe, SiC, GaP, GaAlAs, AlInGaP, and the like, in addition to the nitride semiconductor. As these semiconductors, laminates in which an n-type semiconductor layer, a light emitting layer, and a p-type semiconductor layer are sequentially stacked may be used. As the light emitting layer (active layer), a multilayer semiconductor having a multi-quantum well structure or a single quantum well structure or a multilayer semiconductor having a double hetero structure may be used. In addition, as the light emitting device 20, a light emitting device having any wavelength may be selected according to an application such as a display application, an illumination application, or the like.

In addition, for example, as illustrated in FIGS. 1 to 3, the reflection molding member 30 may be a structure molded together with the electrode separation line L using a mold on the substrate 10, having a form in which a front surface thereof is opened so as to induce light generated in the light emitting device 20 toward the front of the light emitting device package 100, and having a reflection cup part 31 of which an upper portion is opened so as to accommodate the light emitting device 20 therein and formed of a molding resin. In more detail, for example, the reflection molding member 30 may be formed of an epoxy resin composition, a silicon resin composition, a modified epoxy resin composition, a modified silicon resin composition, a polyimide resin composition, a modified polyimide resin composition, polyphthalamide (PPA), a polycarbonate resin, polyphenylene sulfide (PPS), a liquid crystal polymer (LCP), an acrylonitrile butadiene styrene (ABS) resin, a phenol resin, an acrylic resin, a polybutyrene terephthalate (PBT) resin, an epoxy molding compound containing a reflection material, white silicon containing a reflection material, a photo-imageable solder resistor (PSR), or the like, and these resins may contain a light reflective material such as titanium oxide, silicon dioxide, titanium dioxide, zirconium dioxide, titanium potassium, alumina, aluminum nitride, boron nitride, mullite, chromium, a white based or metal based component, or the like. However, the light emitting resin 20 is not necessarily limited to the contents described above. That is, all types of light emitting devices may be used as the light emitting device 20.

In addition, for example, as illustrated in FIGS. 1 to 3, the upper cover 40, which is a structure formed in a shape corresponding to that of an upper surface of the reflection molding member 30 so as to cover the light emitting device 20 and the opened upper portion of the reflection cup part 31 of the reflection molding member 30, may be a plate-shaped reflector having at least one portion accommodated in a cover accommodation groove H formed in the reflection molding member 30 so as to be firmly fixed to the reflection molding member 30 and formed of a metal.

In more detail, for example, as illustrated in FIGS. 1 to 3, the upper cover 40 may include at least one of a left protrusion 43 formed in at least one portion of a left side surface of the upper cover 40 and protruding leftward, a rear protrusion 42 formed in at least one portion of a rear surface of the upper cover 40 and protruding rearward, and a right protrusion 41 formed in at least one portion of a right side surface of the upper cover 40 and protruding rightward.

As illustrated in FIGS. 1 to 3, the left protrusion 43, the rear protrusion 42, and the right protrusion 41, which are formed of the same material as that of the upper cover 40 and are formed integrally with the upper cover 40, may be protrusions each protruding leftward, rearward, and rightward at the same thickness as that of the upper cover 40 having a quadrangular plate shape. However, the left protrusion 43, the rear protrusion 42, and the right protrusion 41 are not necessarily limited to the type illustrated in FIGS. 1 to 3. That is, all of various types of protrusions each protruding from the upper cover 40 leftward, rearward, and rightward may be used as the left protrusion 43, the rear protrusion 42, and the right protrusion 41.

In addition, as illustrated in FIGS. 1 to 3, the cover accommodation groove H may include a left groove part H3 corresponding to the left protrusion 43, a rear groove part H2 corresponding to the rear protrusion 42, and a right groove part H1 corresponding to the right protrusion 41.

Therefore, as illustrated in FIG. 2, the upper cover 40 may be inserted into and firmly assembled to the cover accommodation groove H, the left protrusion 43, the rear protrusion 42, and the right protrusion 41 may be inserted into the left groove part H3, the rear groove part H2, and the right groove part H1, respectively, such that the upper cover may be more firmly assembled to the reflection molding member 30 in directions such as front and rear directions and left and right directions, a shaft direction, and the like.

In addition, for example, as illustrated in FIG. 1, an adhesive accommodation groove SH in which an adhesive S capable of adhering the upper cover 40 to the reflection molding member 30 is accommodated may be formed in the cover accommodation groove H so that the upper cover 40 may be adhered and fixed to the reflection molding member 30.

Therefore, as illustrated in FIGS. 1 and 2, the upper cover 40 formed of the metal may be more firmly fixed to the reflection molding member 30 formed of the resin in a vertical direction using the adhesive S.

Therefore, as illustrated in FIG. 2, the upper cover 40 may not only be firmly assembled to the reflection molding member 30 in the front and rear directions and the left and right directions and the shaft direction using an assembling structure between the protrusions and the grooves, but also be more perfectly fixed to the reflection molding member 30 in the vertical direction using the adhesive S. This structure is a structure in which the upper cover 40 is firmly fixed to the reflection molding member 30 even though a load, impact, or pressure of a light guide plate 110 is transferred to the interval maintaining part 50 to be described below, and may disperse the load in all of the front and rear directions and the left and right directions, the shaft direction, and the vertical direction, thereby making it possible to significantly improve durability and prevent separation of or damage to components.

In addition, as illustrated in FIGS. 1 to 3, the interval maintaining part 50 may be a structure formed at the upper cover 40 so that a predetermined optical interval may be maintained between the light guide plate 110 and the light emitting device 20 and having a protrusion form protruding from a front surface of the upper cover 40 toward the light guide plate 110 so that a front end thereof may contact the light guide plate 110.

In more detail, for example, as illustrated in FIGS. 1 to 3, the interval maintaining part 50 may have a light guide plate contacting surface F formed at the front end thereof and contacting the light guide plate 110, and may be generally lengthily formed above an inlet of the reflection cup part 31. Therefore, an area of the light guide plate contacting surface F is further increased, thereby making it possible to disperse the load or the impact to a wider area and more precisely maintain an optical distance.

The interval maintaining part 50, which is formed of the same material as that of the upper cover 40 and is formed integrally with the upper cover 40, may be a protrusion protruding forward, that is, toward the light guide plate 110 at the same thickness as that of the upper cover 40 having a quadrangular plate shape. However, the interval maintaining part 50 is not necessarily limited to the type illustrated in FIGS. 1 to 3. That is, all of various types of protrusions protruding forward from the upper cover 40 may be used as the interval maintaining part 50.

In addition, as illustrated in FIGS. 1 to 3, the interval maintaining part 50 may protrude forward from the front surface of the reflection molding member 30 by a protrusion length so as to contact the light guide plate 110. Therefore, only the interval maintaining part 50 may contact the light guide plate 110, and other parts may be spaced apart from the light guide plate 110.

In addition, the light guide plate contacting surface F of the interval maintaining part 50 may be a quadrangular plane type contact surface corresponding to a side surface of the light guide plate 110 so as to be advantageous in dispersing the impact or the load. However, the light guide plate contacting surface F is not necessarily limited thereto. That is, various types of contact surfaces may be used as the light guide plate contacting surface F.

Therefore, as illustrated in FIG. 3, the module substrate M on which a plurality of light emitting device packages 100 according to some exemplary embodiments of the present invention illustrated in FIGS. 1 and 2 are mounted may be spaced apart from the light guide plate 110 by a predetermined distance or more, and the light guide plate 110 may maintain a predetermined optical distance by the internal maintaining part 50. That is, the upper cover 40 that may be precisely aligned with the reflection molding member 30 and be firmly fixed to the reflection molding member 30 in all of the front and rear directions and the left and right directions, the shaft direction, and the vertical direction is used, and the interval maintaining part 50 contacting the light guide plate 110 is installed at the upper cover 40, thereby making it possible to precisely maintaining a spaced distance between the light emitting device 20 and the light guide plate 110. Therefore, luminous intensity and color feeling may be improved, light efficiency may be improved, and various light emitting apparatuses including a light conversion material and a side view type light emitting device may be installed to produce good quality products.

Figure 4:
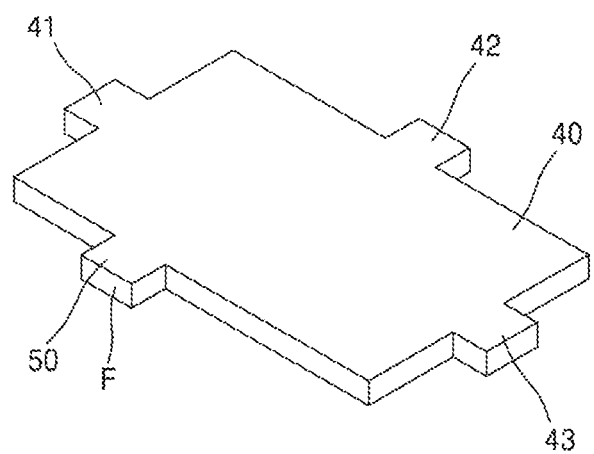
FIG. 4 is a perspective view illustrating another example of an upper cover of the light emitting device package of FIG. 1.

FIG. 4 is a perspective view illustrating another example of an upper cover 40 of the light emitting device package 100 of FIG. 1.

As illustrated in FIG. 4, the interval maintaining part 50 may be a structure having a light guide plate contacting surface F formed at a front end thereof and contacting the light guide plate 110 and partially formed above an inlet of the reflection cup part 31.

Meanwhile, as illustrated in FIGS. 2 and 3, a backlight unit 1000 according to some exemplary embodiments of the present invention, which includes the light emitting device package 100 according to some exemplary embodiments of the present invention described above, may include the module substrate M on which the plurality of light emitting device packages 100 may be mounted; the substrate 10 mounted on the module substrate M and having the first electrode 11 formed at one side thereof on the basis of the electrode separation line L and the second electrode 12 formed at the other side thereof on the basis of the electrode separation line L; the light emitting device 20 including the first pad P1 electrically connected to the first electrode 11 and the second pad P2 electrically connected to the second electrode 12; the reflection molding member 30 installed on the substrate 10, having a form in which a front surface thereof is opened so as to induce the light generated in the light emitting device 20 toward the front of the light emitting device package, and having the reflection cup part 31 of which the upper portion is opened so as to accommodate the light emitting device 20 therein; the upper cover 40 formed in the shape corresponding to that of the upper surface of the reflection molding member 30 so as to cover the light emitting device 20 and the opened upper portion of the reflection cup part 31 of the reflection molding member 30; the light guide plate 110 formed in a light path of the light emitting device 20; and the interval maintaining part 50 formed at the upper cover 40 so that the predetermined optical interval may be maintained between the light guide plate 110 and the light emitting device 20 and protruding from the front surface of the upper cover 40 toward the light guide plate 110 so that a front end thereof may contact the light guide plate 110. Therefore, as illustrated in FIG. 3, luminous intensity of the backlight unit may be uniformly and precisely adjusted and maintained using a plurality of interval maintaining parts 50.

Here, roles and configurations of the substrate 10, the light emitting device 20, the reflection molding member 30, the upper cover 40, the interval maintaining parts 50 may be the same as those of the components of the light emitting device package 100 according to some exemplary embodiments of the present invention. Therefore, a detailed description for these components will be omitted.

Figure 5:
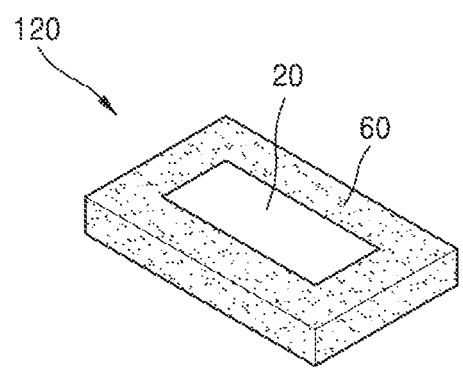
FIG. 5 is a perspective view illustrating a light emitting apparatus of the light emitting device package of FIG. 1.
Figure 6:
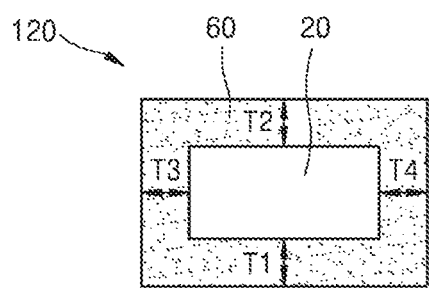
FIG. 6 is a plan view of the light emitting apparatus of FIG. 5.

FIG. 5 is a perspective view illustrating a light emitting apparatus 120 of the light emitting device package 100 of FIG. 1, and FIG. 6 is a plan view of the light emitting apparatus 120 of FIG. 5.

As illustrated in FIGS. 1 to 6, the light emitting device package 100 according to some exemplary embodiments of the present invention may further include a light conversion material 60 formed to enclose at least one of a front surface, a left side surface, a right side surface, and a rear surface of the light emitting device 20 except for an upper surface of the light emitting device 20. The light conversion material 60 may include a phosphor or a quantum dot converting a wavelength of the light generated in the light emitting device 20.

For example, the light emitting device 20 generating the light and the light conversion material 60 converting the light, which are optical elements forming a light source, may be called a kind of light emitting apparatus 120.

In addition, for example, as illustrated in FIG. 6, a thickness T1 of the light conversion material 60 in a front surface direction, a thickness T2 of the light conversion material 60 in a rear surface direction, and thicknesses T3 and T4 of the light conversion material 60 in a right direction and a left direction may be the same as each other. Therefore, optical characteristics generated at a front surface, a rear surface, a left side, and a right side are the same as each other, such that they may appear to be symmetrical to each other.

FIGS. 7 to 11 are plan views illustrating several examples of the light emitting apparatus 120 of FIG. 5.

Figure 7:
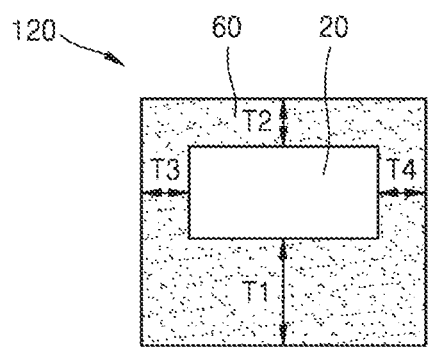
FIGS. 7 to 11 are plan views illustrating several examples of the light emitting apparatus of FIG. 5.

As illustrated in FIG. 7, the light emitting apparatus 120 is not necessarily to the form illustrated in FIG. 6. That is, a thickness T1 of the light conversion material 60 in the front surface direction may be different from thicknesses T2 to T4 of the light conversion material 60 in the other directions. Therefore, for example, the thickness T1 of the light conversion material 60 in the front surface direction may be thicker than those of the light conversion material 60 in the other directions. For example, in the case in which the light emitting device 20 is a blue LED, the probability that light emitted in directions except for the front surface direction will meet a phosphor or a quantum dot to thereby be light-converted is decreased, such that a large amount of blue light may be included in the light emitted in directions except for the front surface direction, and the probability that light emitted in the front surface direction will meet a phosphor or a quantum dot to thereby be light-converted is increased, such that a large amount of light having a wavelength different from that of the blue light may be included in the light emitted in the front surface direction. Therefore, optical characteristics may be changed depending on a thickness of the light conversion material 60, and an optimal light source may be variously implemented in consideration of luminous intensity, light efficiency, or the like, using the fact that the optical characteristics are changed depending on the thickness of the light conversion material 60.

Figure 8:
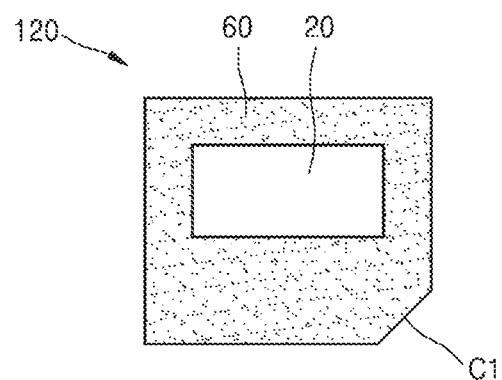
Figure 9:
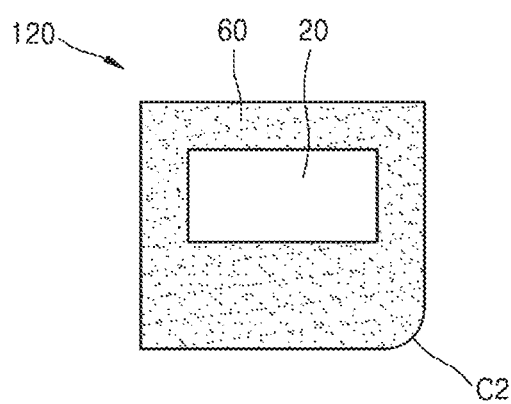

In addition, in the light emitting apparatus 120, a front surface portion of the light conversion material 60 may have an inclined surface C1 formed on an outer surface thereof, as illustrated in FIG. 8, or may have a curved surface C2 formed on an outer surface thereof, as illustrated in FIG. 9. Therefore, optical characteristics may be changed depending on a form of the light conversion material 60, and an optimal light source may be variously implemented in consideration of luminous intensity, light efficiency, or the like, using the fact that the optical characteristics are changed depending on the form of the light conversion material 60.

Figure 10:
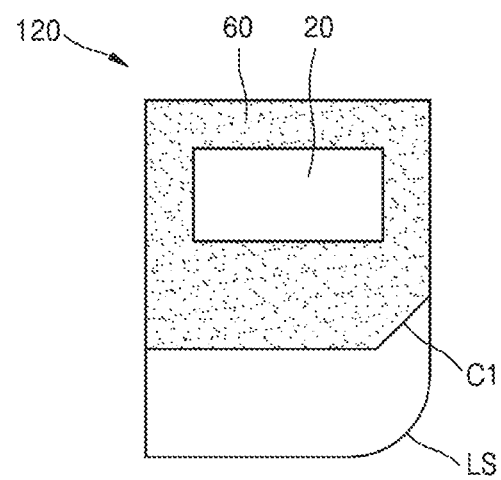

In addition, as illustrated in FIG. 10, the light emitting apparatus 120 may further include a lens part LS having a convex or concave lens surface formed on a front surface portion of the light conversion material 60 and inducing a path of the light. Therefore, optical characteristics may be changed depending on a form of the lens part LS, and an optimal light source may be variously implemented in consideration of luminous intensity, light efficiency, or the like, using the fact that the optical characteristics are changed depending on the form of the lens part.

Figure 11:
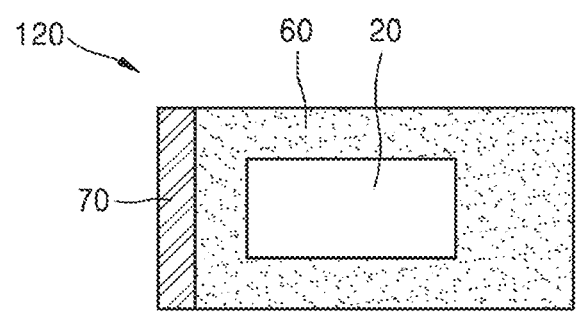

In addition, as illustrated in FIG. 11, the light emitting apparatus 120 may further include a reflection member 70 formed at a left side portion or a right side portion of the light conversion material 60 and reflecting the light. Therefore, optical characteristics may be changed depending on a form of the reflection member 70, and an optimal light source may be variously implemented in consideration of luminous intensity, light efficiency, or the like, using the fact that the optical characteristics are changed depending on the form of the reflection member 70.

FIGS. 12 to 15 are cross-sectional views illustrating steps of a process of manufacturing a light emitting apparatus 120 of a light emitting device package 100 according to some exemplary embodiments of the present invention.

Figure 12:
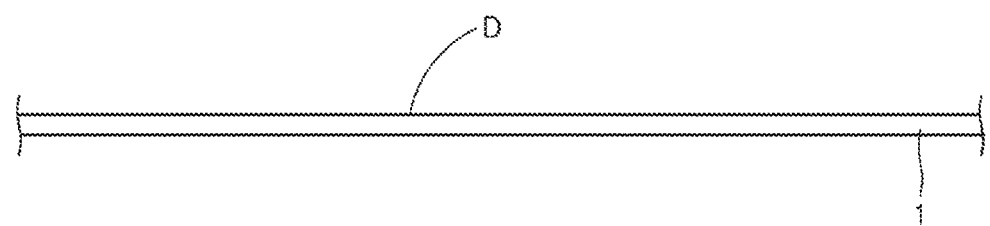
FIGS. 12 to 15 are cross-sectional views illustrating steps of a process of manufacturing a light emitting apparatus of a light emitting device package according to some exemplary embodiments of the present invention.
Figure 13:
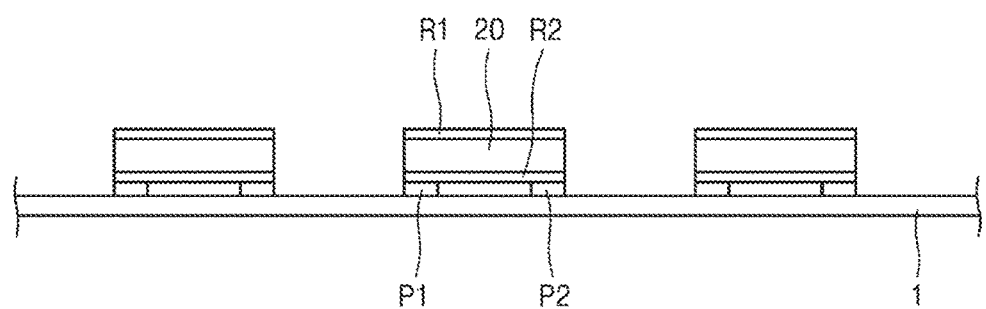

Steps of a process of manufacturing a light emitting apparatus 120 of a light emitting device package 100 according to some exemplary embodiments of the present invention will be described with reference to FIGS. 12 to 15. First, as illustrated in FIG. 12, a release paper 1 having an adhesion surface D formed on one surface thereof may be prepared. Then, as illustrated in FIG. 13, the first pads P1 and the second pads P2 of a plurality of flip-chip type light emitting devices 20 may be seated on the release paper 1. Here, optically, the light emitting devices 20 may include the reflectors R1 and R2 each installed on the upper surfaces and the lower surfaces thereof so as to induce the generated light toward the side surfaces thereof.

Figure 14:
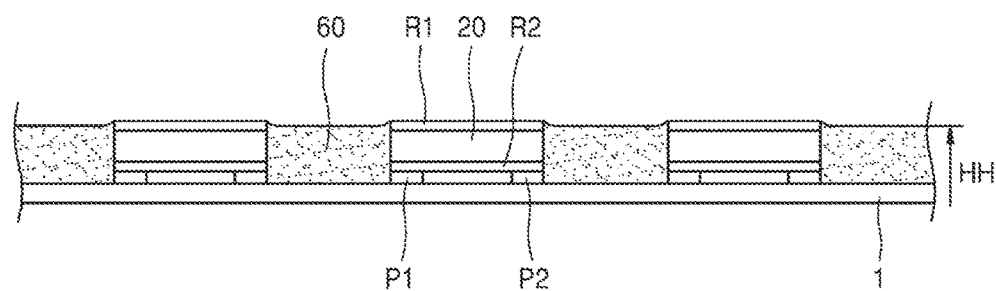

Then, as illustrated in FIG. 14, the light conversion material 60 may be applied onto the release paper 1 by allowing the light conversion material 60 in a flow state to flow in a space between the light emitting device 20 and a neighboring light emitting device 20 at a height equal to or lower than a height HH of the upper surface of the light emitting device 20 so that the light conversion material 60 may enclose the side surfaces of the light emitting devices 20. In this case, the light conversion material 60 may be very simply and rapidly applied by allowing the light conversion material 60 to flow in a space between the light emitting device 20 and the neighboring light emitting device 20 using gravity without using a separate mold.

Figure 15:
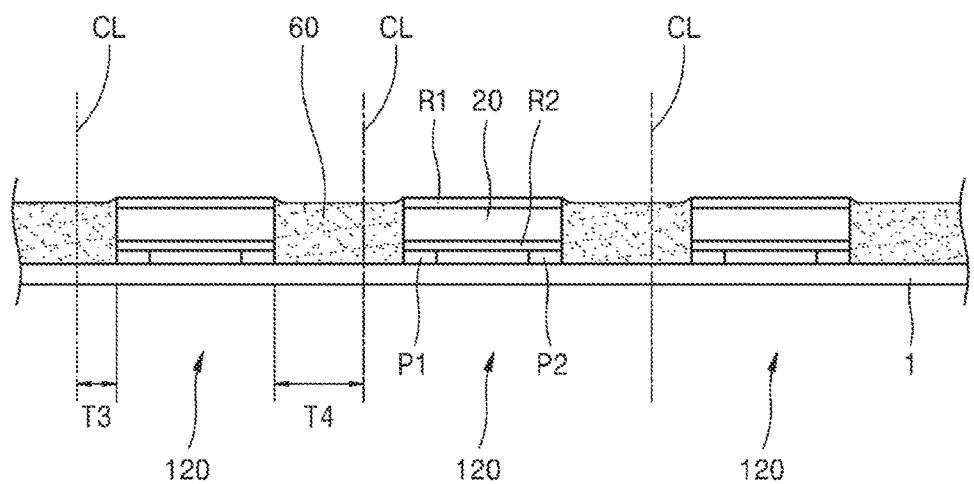

Then, as illustrated in FIG. 15, the light conversion material 60 may be hardened, and may be cut along cutting lines CL so as to be singulated into a plurality of unit light emitting apparatuses. In this case, for example, positions of the cutting lines CL may be variously set, such that thicknesses T3 and T4 of the light conversion material 60 in a side direction may be variously formed. Through this, side view type light emitting apparatuses 120 having various types of optical characteristics are rapidly manufactured at a low cost, thereby making it possible to significantly increase productivity.

Figure 16:
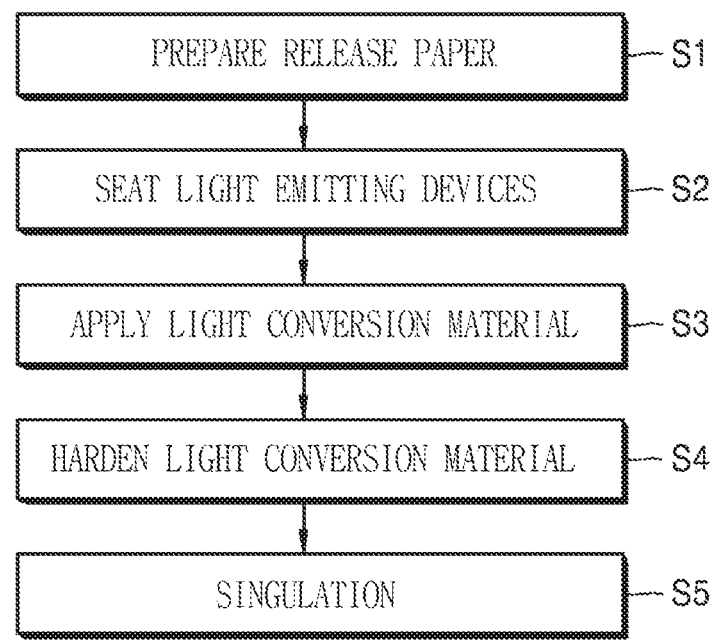
FIG. 16 is a flow chart illustrating a method of manufacturing a light emitting apparatus according to some exemplary embodiments of the present invention.

FIG. 16 is a flow chart illustrating a method of manufacturing a light emitting apparatus 120 according to some exemplary embodiments of the present invention.

As illustrated in FIGS. 1 to 16, the method of manufacturing a light emitting apparatus 120 according to some exemplary embodiments of the present invention may include a release paper preparing step (S1) of preparing the release paper 1 having the adhesion surface D formed on one surface thereof; a light emitting device seating step (S2) of seating the first pads P1 and the second pads P2 of the plurality of flip-chip type light emitting devices 20 on the release paper 1, the light emitting devices including the reflectors R1 and R2 each installed on the upper surfaces and the lower surfaces thereof so as to induce the generated light toward the side surfaces thereof; a light conversion material applying step (S3) of applying the light conversion material 60 onto the release paper 1 by allowing the light conversion material 60 in the flow state to flow in the space between the light emitting device 20 and the neighboring light emitting device 20 at the height equal to or lower than the height HH of the upper surface of the light emitting device 20 so that the light conversion material 60 may enclose the side surfaces of the light emitting devices 20; a light conversion material hardening step (S4) of hardening the light conversion material 60; and a singulation step (S5) of cutting the light conversion material 60 along the cutting lines CL so as to be singulated into the plurality of unit light emitting apparatuses. In another exemplary embodiment of the present invention, the light emitting devices 20 may include the reflectors R1 and R2 each installed on the upper surfaces and the lower surfaces thereof so as to induce the generated light toward the side surfaces thereof.

Figure 17:
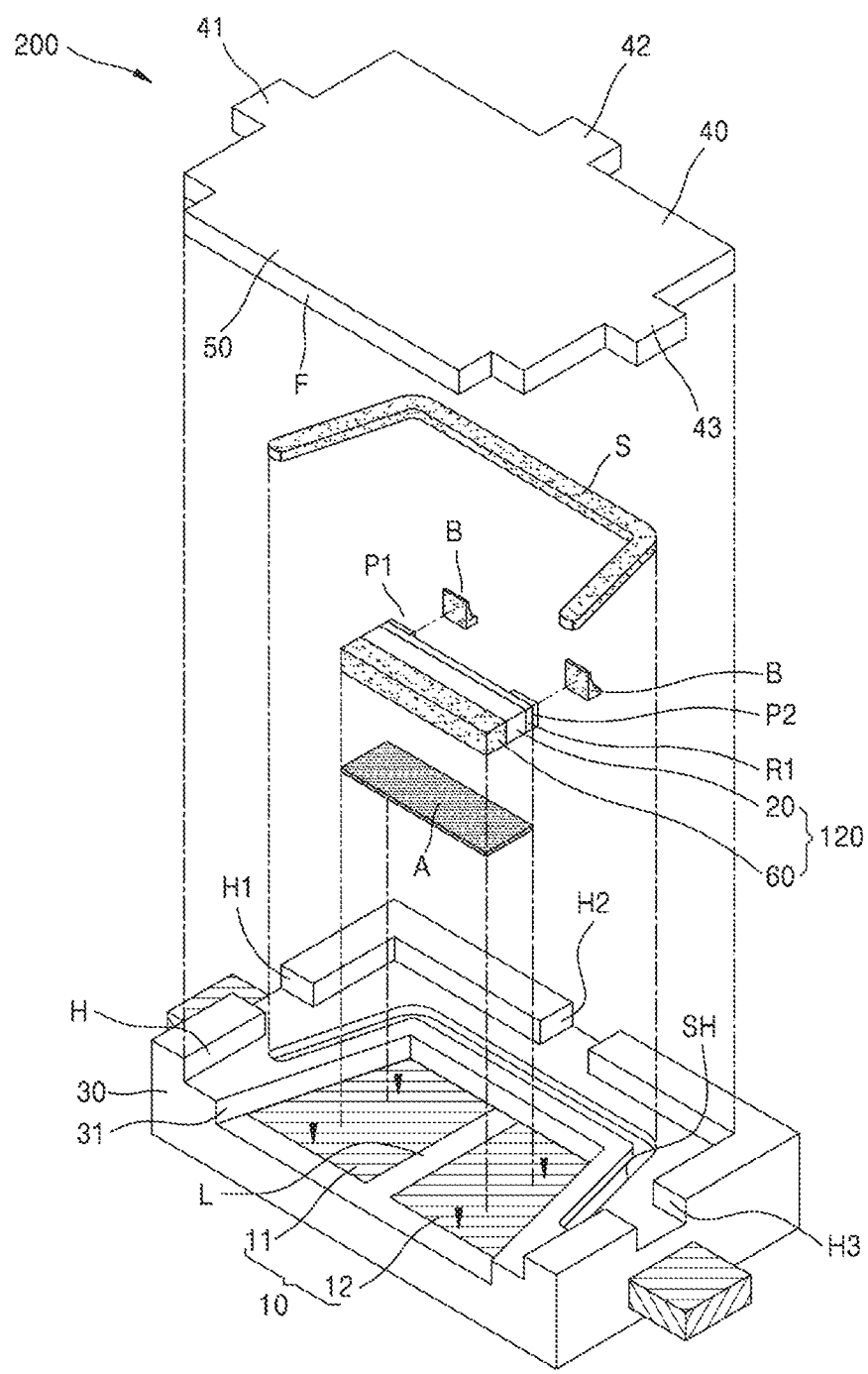
FIG. 17 is an exploded perspective view illustrating a light emitting device package according to some other exemplary embodiments of the present invention.

FIG. 17 is an exploded perspective view illustrating a light emitting device package 200 according to other exemplary embodiments of the present invention.

As illustrated in FIG. 17, a light emitting device 20 of the light emitting device package 200 according to other exemplary embodiments of the present invention may be a vertical mounting type light emitting device of which side surfaces are attached onto the substrate 10 by an adhesive layer A so that light generated in a light emitting layer is directed toward an upper surface of the light emitting device 20, that is, the front of the light emitting device package 200, and a first pad P1 and a second pad P2 are bonded to the substrate 10 by bonding media B so as to be perpendicular to a horizontal surface of the substrate 10.

Here, the bonding media B may be bonded to an angled space between the first pad P1 in a vertical state and the first electrode 11 in a horizontal state and an angled space between the second pad P2 in a vertical state and the second electrode 12 in a horizontal state, respectively.

Here, various types of bonding media containing a solder component such as a solder paste, a solder, or the like, may be used in order to electrically and physically connect firmly the first pad P1 and the first electrode 11 to each other and electrically and physically connect firmly the second pad P2 and the second electrode 12 to each other. In addition, the vertical mounting type light emitting device 20 and the light conversion material 60 such as the phosphor, or the like, may be manufactured in a chip scale package (CSP) form by seating the plurality of light emitting devices 20 on the release paper and applying the light conversion materials 60 onto the release paper, hardening the light conversion materials 60, and then cutting the light conversion materials 60. The light emitting devices 20 may be manufactured by various methods in addition to the method described above.

According to some exemplary embodiments of the present invention configured as described above, the optical distance between the light emitting device and the light guide plate may be precisely maintained, such that the luminous intensity and the color feeling of the backlight unit may be improved and the light efficiency may be improved, and optical characteristics may be changed into various forms, such that products may be optimally designed and a production time and a production cost of the products may be reduced, thereby making it possible to significantly improve productivity. The scope of the present invention is not limited to the above-mentioned effects.

Although the present invention has been described with reference to exemplary embodiments illustrated in the accompanying drawings, it is only an example. It will be understood by those skilled in the art that various modifications and equivalent other exemplary embodiments are possible from the present invention. Accordingly, the actual technical protection scope of the present invention is to be defined by the following claims.

What is claimed is:

1. A light emitting device package comprising:
   a substrate having a first electrode formed at one side of an electrode separation line and a second electrode formed at the other side of the electrode separation line;
   a light emitting device including a first pad electrically connected to the first electrode and a second pad electrically connected to the second electrode;
   a reflection molding member installed on the substrate, having a form in which a front surface thereof is opened so as to induce light generated by the light emitting device toward a front of the light emitting device package, and including a reflection cup part of which an upper portion is opened so as to accommodate the light emitting device therein; and
   an upper cover formed in a shape corresponding to that of an upper surface of the reflection molding member so as to cover the light emitting device and the opened upper portion of the reflection cup part of the reflection molding member,
   wherein the light emitting device is a vertical mounting type light emitting device including a light emitting layer so as to be in parallel with the first pad and the second pad, and the first pad and the second pad electrically connected to the substrate are substantially perpendicular to the substrate, and
   wherein light generated in the light emitting layer is directed toward an upper surface of the light emitting device corresponding to the front of the light emitting device package.

2. The light emitting device package of claim 1, wherein a side surface of the light emitting device is attached onto the substrate by an adhesive layer.

3. The light emitting device package of claim 1, wherein the first pad and the second pad are bonded to the substrate by bonding media.

4. The light emitting device package of claim 3, wherein the bonding media bonding to an angled space between the first pad in a vertical state and the first electrode in a horizontal state and an angled space between the second pad in a vertical state and the second electrode in a horizontal state, respectively.

5. The light emitting device package of claim 1, wherein the light emitting device includes a light conversion material on an upper surface of the light emitting device and a reflector on a lower surface of the light emitting device.

6. The light emitting device package of claim 1, wherein the light emitting device comprises an interval maintaining part formed at the upper cover such that a predetermined optical interval is maintained between a light guide plate and the light emitting device, the interval maintaining part being protruding from a front surface of the upper cover toward the light guide plate such that a front end thereof contacts the light guide plate.

7. The light emitting device package of claim 6, wherein the interval maintaining part comprises a light guide plate contacting surface being formed at the front end thereof and contacting the light guide plate.

8. The light emitting device package of claim 1, wherein the upper cover comprises a plurality of protrusions configured in such a way that the plurality of protrusions of the upper cover couple with grooves of the reflection molding member to cover the opened upper portion of the reflection cup part of the reflection molding member.

9. The light emitting device package of claim 1, wherein the upper cover includes a plate-shaped reflector having at least one portion accommodated in a cover accommodation groove formed in the reflection molding member so as to be fixed to the reflection molding member and formed of a metal.

10. The light emitting device package of claim 1, wherein:
   the upper cover further includes at least one of a left protrusion formed in at least one portion of a left side surface of the upper cover and protruding leftward, a rear protrusion formed in at least one portion of a rear surface of the upper cover and protruding rearward, and a right protrusion formed in at least one portion of a right side surface of the upper cover and protruding rightward, and
   the cover accommodation groove includes at least one of a left groove part corresponding to the left protrusion, a rear groove part corresponding to the rear protrusion, and a right groove part corresponding to the right protrusion.

11. The light emitting device package of claim 1, wherein the cover accommodation groove includes an adhesive accommodation groove in which an adhesive adhering the upper cover to the reflection molding member is accommodated so that the upper cover is adhered and fixed to the reflection molding member.

* * * * *